(12) United States Patent
Rahman et al.

(10) Patent No.: US 11,218,147 B2
(45) Date of Patent: Jan. 4, 2022

(54) METHOD OF ACHIEVING ROBUSTNESS OF THE DEVICE IN SHORT CIRCUIT CONDITION BY ADJUSTING THE CURRENT LIMIT THRESHOLD BASED REPETITIVE FAULT CONDITION

(71) Applicant: TEXAS INSTRUMENTS INCORPORATED, Dallas, TX (US)

(72) Inventors: Md. Abidur Rahman, Richardson, TX (US); Adam Quirk, Dallas, TX (US); Stephen Nortman, Dallas, TX (US); Sualp Aras, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/018,458

(22) Filed: Sep. 11, 2020

(65) Prior Publication Data

US 2020/0412355 A1 Dec. 31, 2020

Related U.S. Application Data

(62) Division of application No. 16/291,747, filed on Mar. 4, 2019, now Pat. No. 10,812,063, which is a division of application No. 15/225,507, filed on Aug. 1, 2016, now Pat. No. 10,284,191.

(60) Provisional application No. 62/199,682, filed on Jul. 31, 2015, provisional application No. 62/199,711, filed on Jul. 31, 2015.

(51) Int. Cl.
*H02H 3/00* (2006.01)
*H03K 17/082* (2006.01)
*H02H 3/06* (2006.01)
*H02H 5/04* (2006.01)
*H03K 17/08* (2006.01)

(52) U.S. Cl.
CPC .......... *H03K 17/0822* (2013.01); *H02H 3/00* (2013.01); *H02H 3/06* (2013.01); *H02H 3/006* (2013.01); *H02H 5/041* (2013.01); *H03K 2017/0806* (2013.01)

(58) Field of Classification Search
None
See application file for complete search history.

(56) References Cited

U.S. PATENT DOCUMENTS

| | | | |
|---|---|---|---|
| 4,955,069 A | 9/1990 | Ionescu | |
| 5,661,624 A | 8/1997 | Crowe | |
| 6,072,678 A | 6/2000 | Degen | |
| 6,337,788 B1 | 1/2002 | Balakrishnan | |
| 10,812,063 B2 * | 10/2020 | Rahman | H02H 3/00 |
| 10,992,124 B2 * | 4/2021 | Wada | H02M 1/00 |

(Continued)

*Primary Examiner* — Stephen W Jackson
(74) *Attorney, Agent, or Firm* — Ray A. King; Charles A. Brill; Frank D. Cimino

(57) ABSTRACT

A circuit protective system. The system includes an output controlling enablement of a transistor and an input sensing an operational parameter associated with the transistor. The system also includes detection circuitry providing an event fault indicator if the operational parameter violates a condition. The system also includes protective circuitry disabling the transistor in response to the event fault indicator and subsequently selectively applying an enabling bias to the transistor; the enabling bias is selected from at least two different bias levels and in response to a number of event fault indications from the detection circuitry.

15 Claims, 7 Drawing Sheets

(56) References Cited

U.S. PATENT DOCUMENTS

2011/0095738 A1\* 4/2011 Fukuhara ......... H03K 17/08122
　　　　　　　　　　　　　　　　　　　　　　　　323/282
2015/0357904 A1　12/2015　Odell
2018/0261993 A1　 9/2018　Kurniawan \* cited by examiner

METHOD OF ACHIEVING ROBUSTNESS OF THE DEVICE IN SHORT CIRCUIT CONDITION BY ADJUSTING THE CURRENT LIMIT THRESHOLD BASED REPETITIVE FAULT CONDITION

CROSS-REFERENCES TO RELATED APPLICATIONS

This application is a divisional of prior application Ser. No. 16/291,747, filed Mar. 4, 2019, currently pending;

which is a divisional of prior application Ser. No. 15/225,507, filed Aug. 1, 2016, now U.S. Pat. No. 10,284,191, issued May 7, 2019;

which claims priority to, the benefit of the filing date of, and hereby incorporates herein by reference, U.S. Provisional Patent Application 62/199,682, entitled "Method of Achieving Robustness Of The Device In Short Circuit Condition By Adjusting The Current Limit Threshold Based Repetitive Fault Condition," and filed Jul. 31, 2015;

and claims priority to, the benefit of the filing date of, and hereby incorporates herein by reference, U.S. Provisional Patent Application 62/199,711, entitled "Energy Limit Technique to Operate Power FETs within SOA Boundary," and filed Jul. 31, 2015.

STATEMENT REGARDING FEDERALLY SPONSORED RESEARCH OR DEVELOPMENT

Not Applicable.

BACKGROUND OF THE INVENTION

The preferred embodiments relate to power electronic systems and methods, such as those driven with power field effect transistors (FETs).

Some electronically-driven power devices incur high transient conditions. For example, in automotive body module applications, such as energizing an incandescent bulb coil at cold temperatures, very high peak in-rush current may be required to initially drive the coil, such as current demands in the range of approximately 90 A to 100 A. Thus, circuit demands, such as at cold start-up, tend toward requiring high current flow to meet the device (or customer) demands. Typically, a high-side power FET is used as switch to allow this much current to flow. The need for, and provision of, high current levels, however, raises other design complexities. Particularly, in high current applications, it is recognized that in some circuit conditions, current level can exceed even the anticipated high supply provided. For example, if a true short-circuit develops in the load, then very large amounts of current may flow, while that current is sourced immediately to ground via the short. As another example, where the load is inductive, as can be the case for an incandescent bulb, then there is a sudden negative voltage spike across the inductive load when its supply voltage is suddenly reduced or removed—a condition known as flyback.

Given the preceding considerations, some effort exists in the prior art to include some type of control on the FET gate, so that current can be limited in some measure so that it does no reach a level that could damage the FET, the load, or other related circuitry. One such approach provides an analog control, which attempts to regulate the FET sourced current to not exceed a particular level. This approach, however, is not always effective as the analog nature may permit some deviation in the amount of sourced current.

Another approach disables current flow in response to instantaneous current or power exceeding a set threshold. This approach, however, dictates a high current threshold, and such a threshold, therefore can lead to very high voltage across the FET in instances other than the in-rush event, such as the true short circuit or flyback. These high voltage events, therefore, can stress, damage, or otherwise violate the safe operating area (SOA) boundary violations of the FET, for example, during switch turn-on, switch turn-off, and other events. Moreover, the instantaneous nature of such a circuit causes a shutdown of current flow when the monitored threshold is exceeded, followed typically by a delay and re-try, that is, where power is restored following the threshold-detection. However, if the current demands of the circuit rise quickly yet for a short time, the protective circuit may immediately respond by disabling current flow, then re-try only to repeat the disablement, with the process causing repeated failures in sourcing current that is otherwise needed for normal operation of the application. Moreover, repeated re-tries, that is, repeated application of current into a short circuit, may cause large thermal accumulation on the power circuit, also tending toward circuit damage.

Given the preceding, while the prior art approaches may be acceptable in certain implementations, some applications may have requirements that are not sufficiently addressed by the prior art. Alternatively, such approaches may be deemed unacceptable to an electronics customer seeking to implement an application. Thus, the present inventors seek to improve upon the prior art, as further detailed below.

BRIEF SUMMARY OF THE INVENTION

In a preferred embodiment, there is a circuit protective system. The system includes an output controlling enablement of a transistor and an input sensing an operational parameter associated with the transistor. The system also includes detection circuitry providing an event fault indicator if the operational parameter violates a condition. The system also includes protective circuitry disabling the transistor in response to the event fault indicator and subsequently selectively applying an enabling bias to the transistor; the enabling bias is selected from at least two different bias levels and in response to a number of event fault indications from the detection circuitry.

Numerous other inventive aspects are also disclosed and claimed.

DETAILED DESCRIPTION OF EMBODIMENTS

Figure 1:
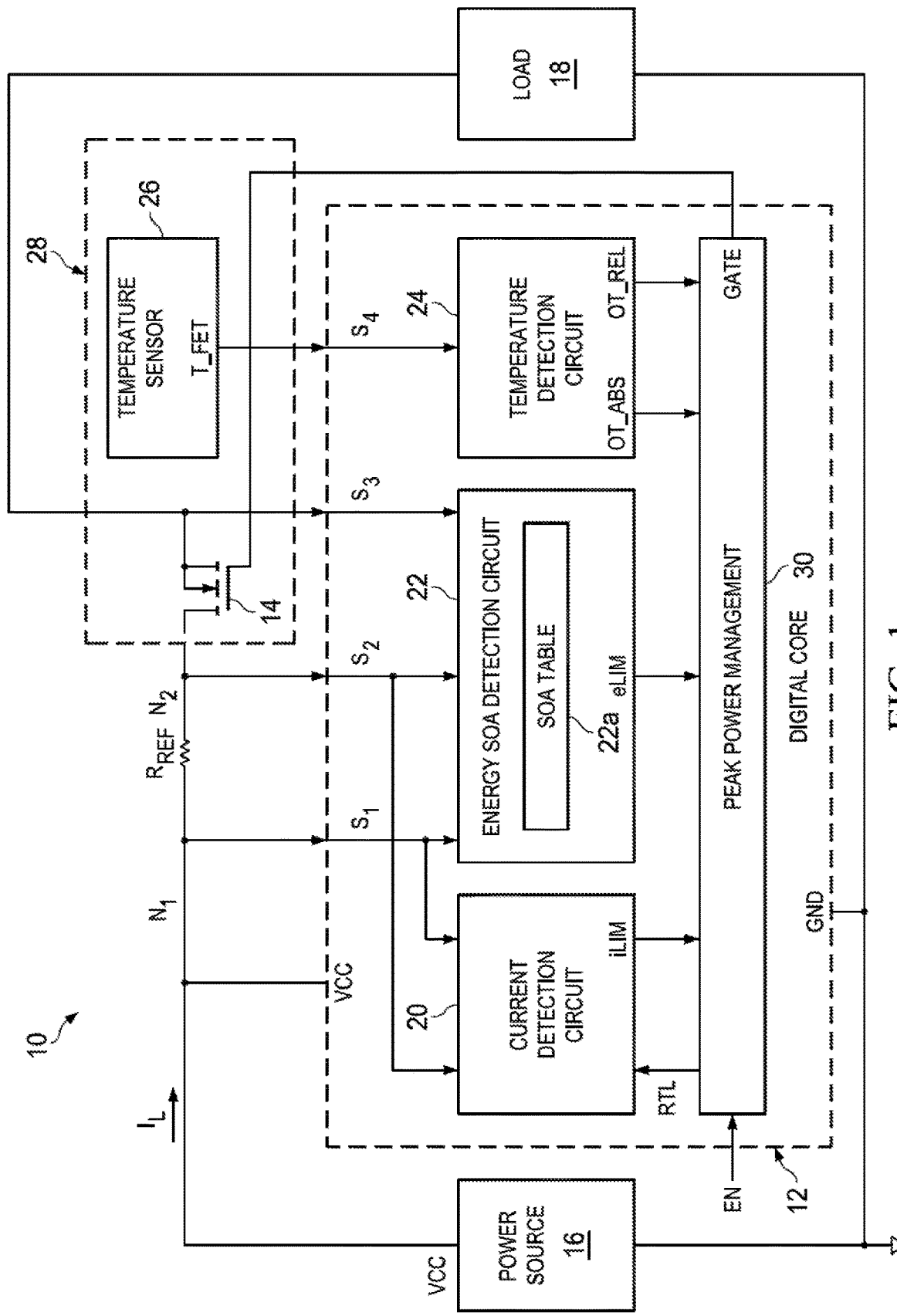
FIG. 1 illustrates a preferred embodiment system 10 for detecting one or more measures of possible power circuit fault conditions and controlling current re-tries on a reduced power level.

FIG. 1 illustrates a block diagram of a preferred embodiment system 10 for detecting one or more measures of possible power circuit fault conditions and controlling current re-tries on a reduced power level. System 10 includes a digital core 12, which may be constructed of various devices so as to achieve the functionality described below. For example, digital core 12 may be implemented as part of a processor (including appropriate programming) or as an integrated circuit module, akin in some respects to commercially available power controllers that are used in connection with thermal or power detection of an associated power transistor. Indeed, in FIG. 1, a power transistor 14 is connected to digital core 12 and, as detailed below, so that core 12 may sense circuit operational events, and in response selectively control the on/off operation of that transistor 14. Further, one contemporary example for certain types of such sensing and control is in a TPS2482 power controller sold by Texas Instruments Incorporated, so core 12 may in certain respects incorporate the functionality of that device with further circuit and control augmentations to accomplish the operational aspects described herein. In any event, digital core 12 in FIG. 1 is shown enclosed by a dashed rectangle as representing one possible integrated circuit packaging of the functionality of that device.

Looking to device connectivity in FIG. 1, digital core 12 is powered between a DC reference voltage VCC from a power source 16 and ground, where the reference supply voltage is sometimes referred to by other conventions, such as VBB if a battery power provides the voltage. Further, power source 16 is connected through a reference resistor $R_{REF}$ and through the source/drain path of transistor 14 to a load 18, where, for example, load 18 may include an inductive element. For example, and as introduced earlier in the Background of the Invention section, load 18 may include an incandescent bulb, which has inductive properties particularly when first energized and prior to the bulb filament heating (and hence becoming more resistive). A preferred embodiment is particularly well-suited for such a load and for the power FET driving it.

Digital core 12 preferably includes a current detection circuit 20. Current detection circuit 20 is connected to two digital core sensing inputs, a first $S_1$ for sensing the potential at a node $N_1$, which is connected between power source 16 and a first terminal of resistor $R_{REF}$, and a second $S_2$ for sensing the potential at a node $N_2$, which is connected between a second terminal of resistor $R_{REF}$ and the drain of transistor 14. Current detection circuit 20 is operable to develop a measure of current $I_L$, such as by dividing the potential across resistor $R_{REF}$ (i.e., as sensed between inputs $S_1$ and $S_2$) by the known resistance of that resistor. Moreover, current detection circuit 20 compares the measured current (and optionally, power) to a safe operating threshold and, in that event that threshold is exceeded, circuit 20 asserts an event output iLIM, so named to denote that current (designated by "i" before "LIM") has exceeded a given limit. In these manners, note that current detectors and comparators are well-known and thus one skilled in the art may select from various architectures so as to implement circuit 20 and its respective functionality.

Digital core 12 also preferably includes an energy safe operating area (SOA) detection circuit 22, which is also connected to sensing inputs $S_1$ and $S_2$. Energy SOA detection circuit 22 is also connected to a digital core third sensing input $S_3$, which is connected to the source of transistor 14 and also to a first terminal of load 18. SOA detection circuit 22 is operable to develop one or more measures of energy, that is, power over time, that is applied to transistor 14. As detailed later, such measures may be obtained by counting frequency pulses over different time windows, where each pulse represents a certain amount of power across transistor 14, derived from current $I_L$ and the voltage across that transistor. Moreover, energy SOA detection circuit 22 compares the measured energy to an SOA boundary as defined in an SOA table 22$a$, and, in the event that boundary is exceeded, circuit 22 asserts an event output eLIM, so named to denote that energy (designated by "e" before "LIM") has exceeded a given limit. In these manners, note that numerous other details with respect to a preferred embodiment manner of implementing SOA detection circuit 22, and its functionality, are provided later.

Digital core 12 also includes a temperature detection circuit 24. Temperature detection circuit 24 is connected to a digital core fourth sensing input $S_4$, which is connected to an output of a temperature sensor 26. Temperature sensor 26 is preferably integrated onto a same integrated circuit package 28 as transistor 14, such as is available in NexFET Power MOSFET packages commercially available from Texas Instruments Incorporated. In such an approach, sensor 26 is therefore operable to output a signal, T_FET, representative of the temperature of the package and its power transistor 14. In this regard, sensor 26 may be of various forms, such as a diode, thermocouple, or resistance temperature detector (RTD) that provides a signal proportional to temperature, where in FIG. 1 that signal is T_FET. Temperature detection circuit 24 also includes its own thermal detector, and it is therefore operable to provide an event output OT_ABS, which is asserted if the absolute temperature of digital core 12 is over (i.e., exceeds) some limit. Further, temperature detection circuit 24 is also operable to provide an event output OT_REL, which is asserted if the temperature of digital core 12, relative to that of temperature sensor 26 (i.e., from T_FET), exceeds some limit.

Digital core 12 also includes a peak power management block 30. Peak power management block 30 is connected to receive an enable input EN so as to turn on portions of digital core 12, where the enable input EN may be provided by a customer implementing system 10. Hence, asserting EN can enable peak power management block 30 and its functionality, which is further connected to receive the event outputs from each of blocks 20, 20, and 22, that is, to receive iLIM, eLIM, OT_ABS and OT_REL, which as described above any one or more of which is asserted when a corresponding event occurs indicating an evaluated parameter has exceeded a corresponding limit. Peak power management block 30 also has a GATE enable output, which is connected to the gate of power transistor 14 (where a gate driver can be part of the connection either within block 30 or controlled by the GATE signal, and in the latter case the gate driver thus drives the transistor gate). In a preferred embodiment, peak power management block 30 includes sufficient circuitry, such as a state machine, so as to respond to the four event outputs from circuits 20, 22, and 24. More specifically, and as detailed below, peak power management block 30 responds to these event outputs by selectively applying, via the GATE enable output, a gate bias to enable or disable the current path through transistor 14. Moreover, the selective control can be at one of at least two different bias levels, based on the history of assertion of the event outputs. By way of further introduction to this aspect, note that any assertion of an event output may be considered a fault condition, that is, a condition in which load 18 is drawing sufficient current so as to suggest an unacceptably large (i.e., faulty) amount of current as indicated by iLIM, and an unacceptably large (i.e., faulty) amount of energy as indicated by eLIM, or resulting in an unacceptably large (i.e., faulty) amount of temperature, as indicated by either OT_ABS or OT_REL Thus, each event output represents a possible fault in the operation of system 10 and, as a result, in an effort to reduce the possibility of the event persisting, or to reduce its magnitude, peak power management block 30 operates to selectively reduce current flow from a normal or nominal higher level to a so-called foldback mode, so as to reduce the possibility of a systemic failure in either transistor 14 or load 18, that otherwise might arise from a history of repeated faults. Also in connection with a preferred embodiment, note that when the foldback mode is entered, peak power management block 30 can assert a reduced threshold limit RTL to current detection circuit 20.

Figure 2:
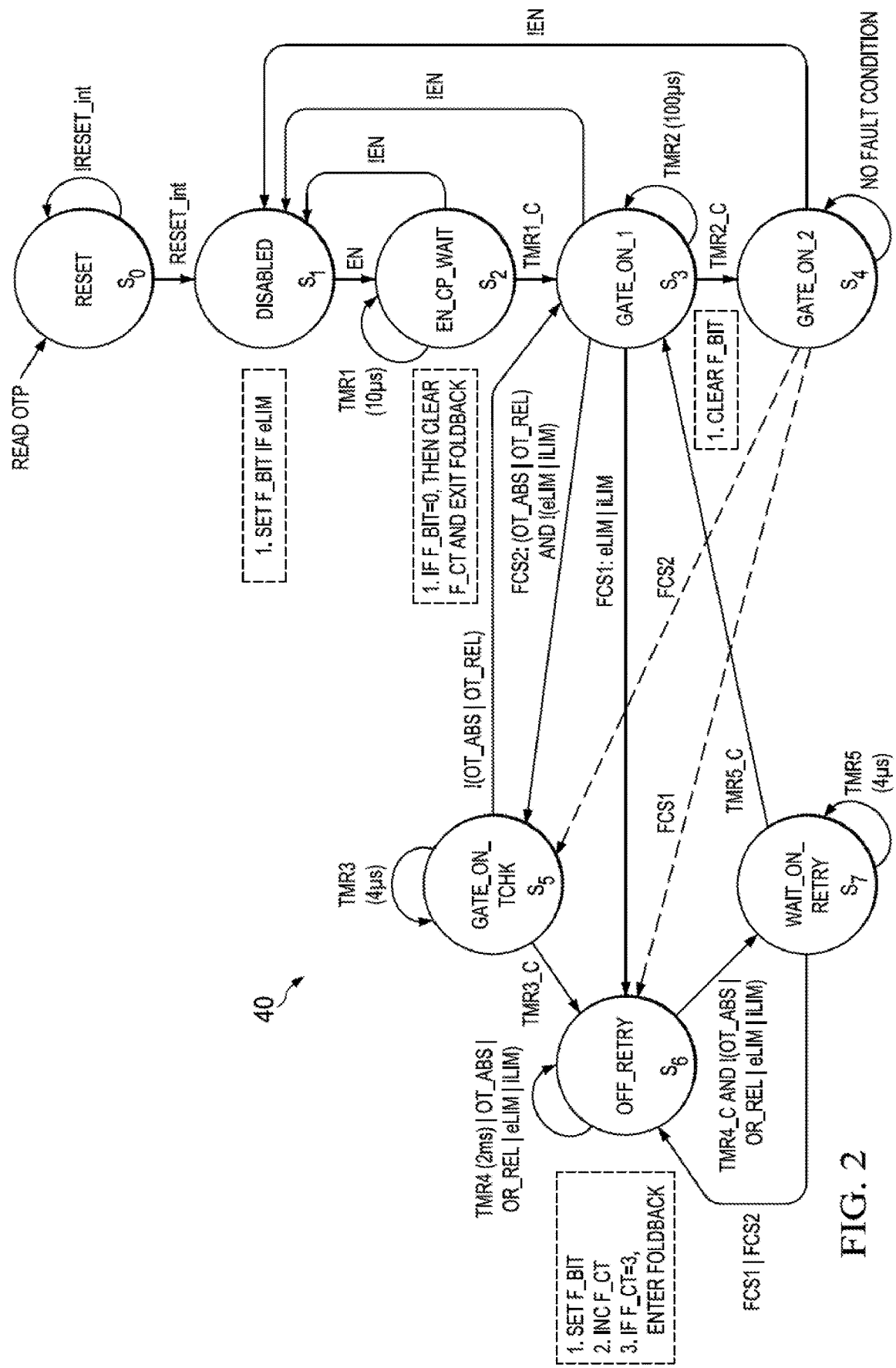
FIG. 2 illustrates a state diagram of operation of the peak power management block 30 from 1.

FIG. 2 illustrates a state diagram 40 of operation of peak power management block 30 from FIG. 1. In general, diagram 40 includes eight states $S_0$ through $S_7$, and each is labeled with a descriptor associated with the state of certain circuitry or functionality during the state. Diagram 40 starts with a RESET state $S_0$, which is reached during some level of system start-up. In the example shown, a one time programmable (OTP) memory may be read as a condition to be completed after which the RESET state $S_0$ is reached. Note that the RESET state $S_0$ can apply to only certain devices in system 10 (see, FIG. 1) where, for example, digital core 12 remains disabled during RESET and, hence, so does transistor 14 as its gate is not enabled and, as a result, current $I_L$ is not yet provided to load 18. The device remains in the RESET state $S_0$ while a separate internal reset RESET_int is asserted. Once RESET_int is no longer asserted, as shown by convention in FIG. 2 as !RESET_int (i.e., the exclamation point preceding the signal name indicates non-assertion of the signal, a convention used throughout this document), diagram 40 moves to a next DISABLED state $S_1$.

In the DISABLED state $S_1$, portions of digital core 12 are enabled, including at least energy SOA detection circuit 22, and other detection circuits also may be enabled. Note as shown in a dotted box to the left of the DISABLED state $S_1$, if the eLIM signal is asserted during the state, then a fault bit F_BIT is set. This contingency is preferably included in recognition, as further evident below, that the DISABLED state $S_1$ also may be reached when the enable signal EN is de-asserted; such de-assertion, however, may cause an energy spike, as may be the case, for example, when load 18 is inductive, in which case the disablement (i.e., de-assertion of EN) may cause flyback, a condition known in the art to impose a large burst of energy on a driving transistor, such as transistor 14. In this instance, therefore, the already-enabled SOA detection circuit 22 is operable to detect the energy burst and, as described earlier, if that burst exceeds the SOA, eLIM is asserted, in which case as shown in FIG. 2 the fault bit F_BIT is also set. The setting of this bit therefore memorializes the SOA-exceeding event as a fault condition, for reasons that will be more apparent later. In any event, the state flow remains in the DISABLED state $S_1$ until enable EN is asserted, at which point diagram 40 moves to a next EN_CP_WAIT state $S_2$.

In the EN_CP_WAIT state $S_2$, digital core 12 is fully enabled and it waits for a timer TMR1 to elapse, where in a preferred embodiment example timer TMR1 is for 10 μs (i.e., μsec). The period of timer TMR1 allows analog circuitry to become fully operational, in response to the asserted enable EN signal. For example, the "CP" indication in this state alludes to a charge pump, which while not shown is used in a preferred embodiment to step up the battery voltage for higher voltage requiring loads (e.g., in an automobile, where a battery may be 12 or 24 volts, while loads may require greater voltage); hence, the EN_CP_WAIT state $S_2$ permits the charge pump to fully charge toward its ultimate output voltage. As another example, as noted above a gate driver may be used in connection with the driving of the gate of transistor 14, and, thus, the EN_CP_WAIT state $S_2$ timer also allows this gate driver to fully turn on. Note also that during the EN_CP_WAIT state $S_2$, if the enable signal EN is de-asserted (as shown in FIG. 1 by "!EN"), then diagram 40 returns to the DISABLED state $S_1$. If however the circuit remains enabled, then once timer TMR1 completes its 10 μs period (as indicated in FIG. 2 by "TMR1_C"), then diagram 40 moves to a next GATE_ON 1 state $S_3$. Note also in connection with this transition to the GATE_ON 1 state $S_3$ that a condition is checked, that is, whether the fault bit F_BIT is set to zero; this may occur, for example, if the device has just been reset and enabled and no fault condition has been detected, or if the device had been reset, disabled, then enabled, and any detected fault since then had been cleared due to a sufficiently long period of operation without detecting a fault, as will be described below in connection with the GATE_ON_2 state $S_4$. If the checked condition is that the fault bit F_BIT is set to zero, then a fault counter F_CT, which accumulates a number of successive fault conditions, is cleared to zero, and the foldback mode is exited so that nominal full current can be permitted to flow; these operations will be further understood below after additional discussion. Note also in this regard that in a preferred embodiment, for minimizing gates, the fault counter F_CT may be implemented as a 2-bit counter, in which case its value maximizes at a count of three.

In the GATE_ON_1 state $S_3$, peak power management block 30 of digital core 12 asserts the GATE signal so as to enable transistor 14. If the state flow has not yet yielded the foldback mode, then the GATE signal is asserted at the nominal value (i.e., nominal mode) to accommodate the specification of load 18. For example, where load 18 is an incandescent bulb, then the nominal GATE bias asserted in the GATE_ON_1 state $S_3$ is sufficient to provide current $I_L$ equal to 90 A to 100 A. To the contrary, if since the last reset of diagram 40 the foldback mode has been entered and not yet exited, then peak power management block 30 still asserts the GATE signal so as to enable transistor 14, but at a foldback level that is less than nominal, for example, at a 50% level, in which case in the present example to provide current $I_L$ equal to 45 A to 50 A. For either the nominal or foldback GATE potential in the GATE_ON_1 state $S_3$, the state waits for a timer TMR2 to elapse, where in a preferred embodiment example TMR2 is for 100 µs. The period of timer TMR2 allows transistor 14 to source current for the entire time, thereby providing a 100 µs time window during which each of detection circuits 20, 22, and 24 operates to potentially detect a respective fault condition. Indeed, if current detection circuit 22 asserts iLIM due to a high current fault condition, or if energy SOA detection circuit 24 asserts eLIM due to a high energy fault condition, then state diagram 40 moves to an OFF_RETRY state $S_6$, a state detailed later. For sake of reference, either of these two fault conditions are designated in FIG. 2 as part of a fault condition set FCS1, shown as eLIM iLIM, where the vertical bar (i.e., "|") is intended to mean a logical OR, as shown here and by convention in the rest of the Figure and text. Additionally in the GATE_ON_1 state, if temperature detection circuit 24 asserts either OT_ABS or OT_REL due to a high (absolute or relative) temperature fault condition, and fault condition set FCS1 is not occurring, then state diagram 40 moves to a GATE_ON_TCHK state $S_5$, another state detailed later. For sake of reference, each of these two fault conditions is designated in FIG. 2 part of a fault condition set FCS2, shown as OT_ABS|OT_REL Also during the timer TMR2 period, if the enable signal EN is de-asserted, then diagram 40 returns to the DISABLED state $S_1$, where GATE of peak power management block 30 is de-asserted in which case the transistor gate is turned back off (i.e., disabled).

Note that the enable signal EN can be de-asserted for various reasons, such as by way of a system designer, customer or the like implementing system 10, who may have EN de-assert in response to a detected fault condition (as indicated via a status pin) or for some other reason, either by coincidence or in response to some other condition. Lastly, if neither a fault condition is detected nor EN disabled, and then if timer TMR2 completes its 100 µs period (as indicated in FIG. 2 by "TMR2_C"), then diagram 40 moves to a next state GATE_ON_2, and if the fault bit F_BIT was previously set before this transition, it is cleared as part of the state transition from the GATE_ON_1 state $S_3$ to the GATE_ON_2 state $S_4$.

From the above, one skilled in the art will appreciate that the GATE_ON_2 state $S_4$ is reached so long as EN is asserted and no fault condition has been detected for at least 100 µs (possibly longer, depending on earlier state(s)). In general, therefore, the GATE_ON_2 state $S_4$ represents a steady-state of on operation for transistor 14, so long as no new fault condition is detected and EN continues to remain asserted. Further, in the GATE_ON_2 state $S_4$, the GATE signal continues as was asserted from the GATE_ON_1 state $S_3$, that is, either at a nominal GATE bias (e.g., to source $I_L$ at 90 A to 100 A) or at a foldback mode level (e.g., to source $I_L$ at 50% of the nominal level, that is 45 A to 50 A). For either the nominal or foldback GATE potential in the GATE_ON_2 state $S_4$, as shown by dashed arrows, if a fault condition is detected, the diagram continues to states introduced above. As one possibility, if fault condition set FCS1 is satisfied, then as was the case for the GATE_ON_1 state $S_3$, also in the GATE_ON_2 state $S_4$, the diagram moves to the OFF_RETRY state $S_6$. As another possibility, if fault condition set FCS2 is satisfied, then as was the case for the GATE_ON_1 state $S_3$, also in the GATE_ON_2 state $S_4$, the diagram moves to the GATE_ON_TCHK state $S_5$. Also during the GATE_ON_2 state $S_4$, if the enable signal EN is de-asserted, then diagram 40 returns to the DISABLED state $S_1$, where GATE of peak power management block 30 is de-asserted in which case the transistor gate is turned back off.

The previous discussion demonstrates that if a fault condition set FCS2 from either OT_ABS or OT_REL is detected during GATE_ON_1 or GATE_ON_2, then diagram 40 moves to the GATE_ON_TCHK state $S_5$. In this state, GATE of peak power management block 30 continues to be asserted to keep on transistor 14 during a relatively short period of 4 µsec, as indicated by timer TMR3. Note that during this timer TMR3 period, if the temperature fault indicated by either (or both) of OT_ABS or OT_REL resolves, then diagram 40 returns to the GATE_ON_1 state. Thus, the GATE_ON_TCHK state $S_5$ represents a short time check (i.e., 4 µsec) during which any temporary or noise-induced spike that might cause OT_ABS or OT_REL to be asserted may resolve, thereby retuning to the previous state. If, however, the temperature fault indicated by either (or both) of OT_ABS or OT_REL does not resolve during the timer TMR3 period, then diagram 40 moves to the OFF_RETRY state $S_6$.

The previous discussion demonstrates that if a fault condition set FCS1 from either eLIM or iLIM is detected during the GATE_ON_1 state $S_3$ or the GATE_ON_2 state $S_4$, or if a temperature fault exists and does not resolve by the timer TMR3 period, then diagram 40 moves to the OFF_RETRY state $S_6$. In this state, GATE of peak power management block 30 is de-asserted to turn off transistor 14, and the state is maintained for a timer TMR4 of 2 ms (i.e., msec). Note that by turning off transistor 14, it is expected that the detected fault condition, from any of eLIM, iLIM, OT_ABS, or OT_REL, should resolve, as current $I_L$ is thus not being sourced during the state. Thus, once the 2 ms of timer TMR4 completes, and assuming that indeed any fault condition resolves, then diagram 40 moves from the OFF_RETRY state to a WAIT_ON_RETRY state $S_7$, during which transistor 14 remains off. Also in connection either with the OFF_RETRY state $S_6$ or its transition to the WAIT_ON_RETRY state $S_7$, and as shown in a dotted box to the left of the state, note that three actions are taken: (i) the fault bit F_BIT is set, confirming that a fault was detected (that fault having caused the transition to the OFF_RETRY state $S_6$); (ii) the fault counter F_CT is incremented; and (iii) if the fault counter F_CT is equal to (or optionally greater than, depending on the number of available counts) a threshold number of counts, and in a preferred embodiment this threshold is set to three, then the foldback mode is entered, and as introduced earlier, will cause a subsequent level by peak power management block 30 at its GATE output to enable transistor 14 at a reduced level (e.g., 50%), as compared to the nominal operational level for that transistor. Also in a preferred embodiment, during the foldback mode, one or more the thresholds for the event detection circuits 20, 22, and 24 may be altered—for example, in one preferred embodiment, during the foldback mode, in which current is sourced at 50% of nominal, the threshold level of current detection circuit 20 is likewise lowered by 50%, such as in response to the a reduced threshold limit RTL signal from peak power management block 30 to circuit 20, as also may be implemented by right shifting the digital value (i.e., dividing by two) in circuit 20 that indicates the limit. Note also that during the WAIT_ON_RETRY state $S_7$, if a fault occurs (FCS1 or FCS2), then flow returns to state $S_6$, thereby essentially prolonging the time when transistor 14 is re-enabled.

Figure 3A:
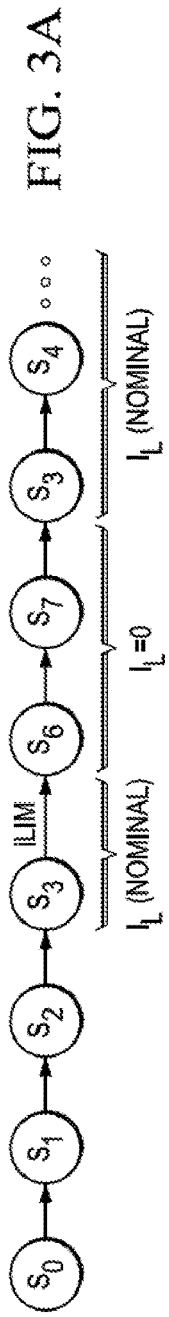
FIG. 3A illustrates a timing sequence diagram of state transition for a first example, where a single fault detection event occurs but is resolved.

FIG. 3A illustrates a timing sequence diagram with a list of state advancement for a first example, to illustrate various of the preceding concepts, where in this example a single fault detection event occurs but is resolved. To simplify this and later drawings, only the state numbers as referenced above are used. Thus, in the example, the state sequence starts with the RESET state $S_0$, RESET_int is asserted to move to the DISABLED state $S_1$, the enable EN is asserted and maintained to move to the EN_CP_WAIT state $S_2$ and timer TIMR1 completes and the sequence thus moves to the GATE_ON_1 state $S_3$, where transistor 14 is enabled so as to begin toward sourcing current at its nominal level. During the timer TMR2 period of the GATE_ON_1 state $S_3$, however, the example assumes a current fault event is detected, so iLIM is asserted. As a result, the sequence moves to the OFF_RETRY state $S_6$, at which point peak power management block 30 de-asserts GATE to thereby turn off transistor 14 and its supply of current $I_L$. Hence, transistor 14 is protected from sourcing current $I_L$ to a potentially-damaging level, and with the current off, current detection circuit 20 no longer detects a threshold-exceeding current, so iLIM is de-asserted, while concurrently timer TMR4 proceeds and elapses. Meanwhile, the fault bit F_BIT is set, the fault counter F_CT is incremented to a value of one, and once the timer TMR4 elapses, the sequence continues to WAIT_ON_RETRY state $S_7$, where it remains for the timer TMR5 to complete, followed by a transition to the GATE_ON_1 state $S_3$ (so long as no fault returns). In the GATE_ON_1 state $S_3$, peak power management block 30 again asserts GATE at the full nominal level, as the fault counter F_CT is at a value (i.e., of one) below the foldback threshold (e.g., of three). Assume further that the cause for the earlier current spike has resolved, and no other fault event is detected for the timer TMR2 period of the GATE_ON_1 state $S_3$. Thus, in this example, the sequence continues to the GATE_ON_2 state $S_4$, where it will remain indefinitely, while maintaining transistor 14 on at its nominal level, until a later fault is detected or the enable EN is de-asserted.

Figure 3B:
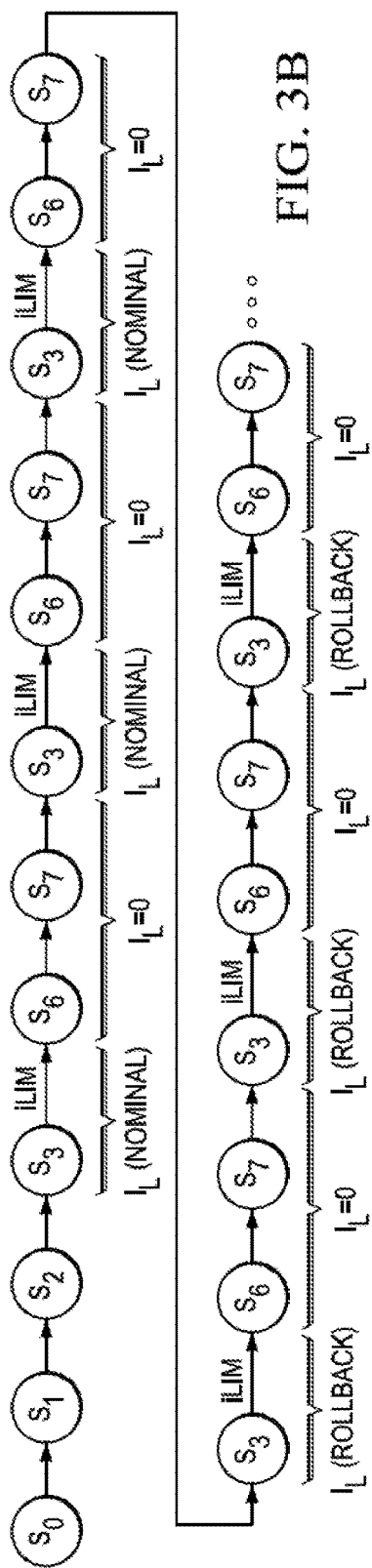
FIG. 3B illustrates a timing sequence diagram of state transition for a second example, where successive fault detection events occur, resulting in an eventual reduction of supply current to a foldback level and the subsequent turning on and off of the transistor for repeated instances at the foldback level, due to a persisting current fault event.

FIG. 3B illustrates a timing sequence diagram with a list of state advancement for a second example, where multiple fault detections occur without a return to the DISABLED state, resulting in reaching the foldback mode. As in FIG. 3A, state sequence starts and proceeds through the RESET state $S_0$, the DISABLED state $S_1$, the EN_CP_WAIT state $S_2$ and moves to the GATE_ON_1 state $S_3$, where transistor 14 is enabled so as to begin toward sourcing current at its nominal level. During the timer TMR2 period of the GATE_ON_1 state $S_3$, however, the example assumes a current fault event is detected, so iLIM is asserted, and as in FIG. 3A, advancing the sequence to the OFF_RETRY state $S_6$, and turning off transistor 14 and its supply of current $I_L$. In the FIG. 3B example, however, while the sequence again moves onward to WAIT_ON_RETRY state $S_7$ and back to the GATE_ON_1 state $S_3$, the example assumes further that the cause of the previous current fault has not been resolved, so iLIM is again asserted, and this process is assumed to repeat for each instance of a return to the GATE_ON_1 state $S_3$ in FIG. 3. As a result, the OFF_RETRY state $S_6$ is reached three times without a return to the DISABLED state S1 in the interim, in which case the fault counter F_CT will have been incremented to a value of three, thereby entering the fallback mode as shown in FIG. 3B following the third occurrence of OFF_RETRY state $S_6$, where the bracket below the immediately nest occurrence of the GATE_ON_1 state $S_3$ shows the current $I_L$ at foldback level. Thereafter, the sequence returns to the GATE_ON_1 state $S_3$, and recall that in the foldback mode, current level detection circuit 20 now reduces its threshold, also for example to 50% of its nominal detecting value. In the FIG. 3B example, however, even at this reduced level, it is assumed that during that state $S_3$, iLIM is again asserted, meaning the reduced foldback threshold for current detection is now exceeded. As a result, the sequence continues to the OFF_RETRY state $S_6$ which is now reached for the fourth time, so the fault counter F_CT is again incremented (to reach a value of four), and the foldback mode is thus maintained because that count exceeds the threshold of three. Thus, the sequence again moves to the WAIT_ON ENTRY state $S_7$, followed by the GATE_ON_1 state S3, and in the example illustrated it is assumed the current fault continues to be detected indefinitely. As a result, the above sequence will recur, with each repeat causing the transistor to be turned off and turned back on again, with the turn on being at the foldback level. In this manner, therefore, even with repeated cycles of turning the transistor on, in each instance it will be protected by limiting its source current below nominal levels. Hence, again transistor 14 is protected from sourcing current $I_L$ to a potentially-damaging level.

Figure 3C:
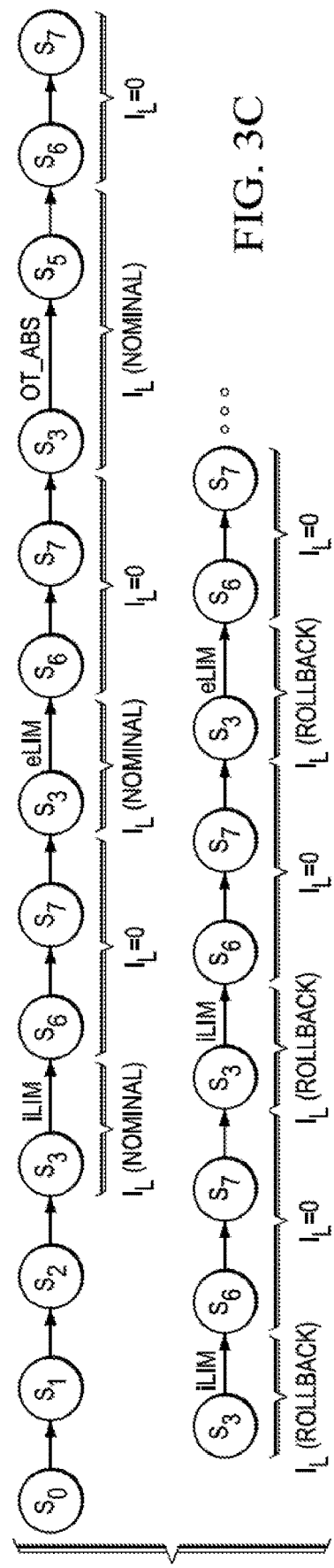
FIG. 3C illustrates a timing sequence diagram of state transition for a third example also with successive fault detection events, but where differing types of faults are occurring yet also result in an eventual reduction of supply current to a foldback level and the subsequent turning on and off of the transistor for repeated instances at the foldback level, due to a persisting current fault event.

FIG. 3C illustrates a timing sequence diagram of state transition for a third example also with successive fault detection events, but where differing types of faults are occurring yet also result in an eventual reduction of supply current to a foldback level and the subsequent turning on and off of the transistor for repeated instances at the foldback level, due to a persisting current fault event. The FIG. 3C assumes the same sequence and first fault through the first seven illustrated steps illustrated, as compared to FIG. 3B. In FIG. 3C, however, in the second instance of the GATE_ON_1 state $S_3$, instead of iLIM being asserted, a different type of fault condition is detected, namely an energy fault as indicated by an assertion of eLIM. The next two states in the sequence, therefore, operate in the same manner as FIG. 3B, and the sequence returns a third time to the GATE_ON_1 state $S_3$; in this third instance, instead of either iLIM or eLIM being asserted, yet another different type of fault condition is detected, namely an over temperature event as indicated by an assertion of OT_ABS. Thus, consistent with the earlier discussion of FIG. 2, the sequence continues to the GATE_ON_TCHK state, which the GATE signal continues to be asserted to enable transistor 14. However, in the example illustrated, the assertion of OT_ABS does not resolve within the timer TMR3 period, so the sequence continues to a third occurrence of the OFF_RETRY state $S_6$. As will the earlier examples of FIGS. 3A and 3B, therefore, current is turned off, followed by entry into the foldback mode thereafter. Moreover, FIG. 3C continues from this point forward to assume at least one type of fault event persists, so as with FIG. 3B, the above sequence will recur, with each repeat causing the transistor to be turned off and turned back on again, with the turn on being at the foldback level.

Having described each of the states in diagram 40, one skilled in the art should now appreciate the nominal and foldback modes of operation of peak power management block 30 and the relationship within system 10. In general, under nominal operation, after the internal reset RESET_int and enable EN are asserted and, for a timer TMR2 period in the GATE_ON_1 state $S_3$ and thereafter in the GATE_ON_2 state $S_4$, peak power management block 30 will assert GATE to enable transistor 14 to source current $I_L$ at a full, nominal level. If, however, a fault event is detected during either of those states, and assuming it is not a short period temperature fault that resolves in less than the timer TMR3 period, then the fault counter F_CT is incremented and, should such a fault event occur at least three times without reaching the state GATE_ON_2 state $S_4$, then peak power management block 30 will assert GATE to enable transistor 14 to source current $I_L$ at a reduced, foldback mode level, and that level continues unless and until: (i) the GATE_ON_2 state $S_4$ is reached; (ii) the device is disabled (de-assertion of EN); and (iii) the device disabling does not cause an eLIM fault condition (which would thus continue to maintain the foldback mode level); and (iv) the diagram 40 then again reaches the GATE_ON_1 state $S_3$. If these four conditions (i) through (iv) are met, then peak power management block 30 will assert GATE to restore an enabling signal to transistor 14 to source current $I_L$ at the full, nominal value, which of course thereafter will be affected based on future events, which can repeat any of the scenarios described above. Also with these observations and provisos, attention is again returned to the dashed box to the left of the DISABLED state; recall this indicates that the fault bit F_BIT is set if an eLIM event occurs when the de-assertion of enable EN occurs. IN such a case, because the fault bit F_BIT is set, then on next reaching the EN_CP_WAIT state $S_2$, if peak power management block 30 was already in foldback mode, it will remain in that foldback mode, as at this point the fault bit F In other words, if peak power management block 30 is in the foldback mode, a de-assertion of enable EN can effectively end the foldback mode when transitioning from the GATE_ON_1 state $S_3$ to the DISABLED state $S_1$ to thereby turn off transistor 14 and then progressing forward through subsequent states to the GATE_ON_1 state $S_3$ to thereby turn transistor 14 back on, so long as eLIM is not asserted in the disablement; if, however, if eLIM is so asserted, then the dashed blocks to the left of the DISABLED and EN_CP_WAIT states, in such an instance, cause control block 18 to remain in the foldback mode even as the diagram 40 then moves to the GATE_ON_1 state $S_3$. In this manner, therefore, additional protection is afforded the circuit and its transistor 14, based on the energy event condition(s) reflected in the eLIM signal.

Figure 4:
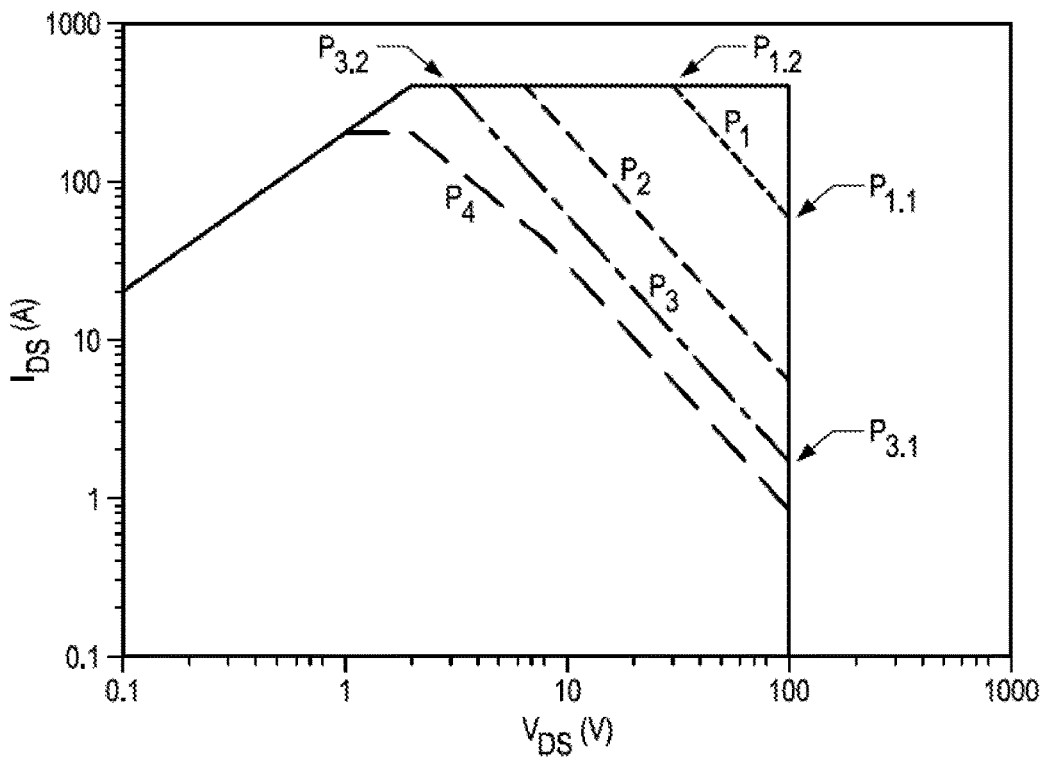
FIG. 4 illustrates a typical prior art plot of current and voltage limits for a transistor.

Returning to FIG. 1, recall that digital core 12 preferably includes an SOA detection circuit 22 with measures of energy, that is, power over time, and circuit 22 compares that measured energy to an SOA boundary as defined in an SOA table 22a. To further illustrate the nature of the data in table 22a, FIG. 4 illustrates a typical prior art plot of current and voltage limits for a transistor, as is often provided in literature (e.g., a datasheet) that is available for users of the device. Particularly, FIG. 4 illustrates transistor drain-to-source voltage ($V_{DS}$) across its horizontal axis, and transistor drain-to-source current ($I_{DS}$) across its vertical axis, both in logarithmic scales. Four different plots $P_1$, $P_2$, $P_3$, and $P_4$, are also shown, where each plot $P_x$ corresponds to a different amount of time at which the current/voltage values are imposed on the transistor. For example, plot $P_1$ illustrates the transistor operation for a period of 100 μs, where, for example, the plot at a point $P_{1.1}$ depicts a limit of operation for a $V_{DS}$ of 100V and an $I_{DS}$ of 60 A, and the plot $P_1$ at a point $P_{1.2}$ depicts a limit of operation for a $V_{DS}$ of 30V and an $I_{DS}$ of 400 A. Similarly, plot $P_3$ illustrates the transistor operation for a period of 10 ms, where, for example, the plot at a point $P_{3.1}$ depicts a limit of operation for a $V_{DS}$ of approximately 100V and an $I_{DS}$ of approximately 1.8 A, and the plot $P_3$ at a point $P_{3.2}$ depicts a limit of operation for a $V_{DS}$ of 30V and an $I_{DS}$ of 400 A. As would be appreciated by one skilled in the art, therefore, for shorter periods of time of operation, the transistor may sustain relatively larger amounts of $V_{DS}$ and/or $I_{DS}$, as compare to longer periods of operation. Indeed, the limits depicted by FIG. 4 are representative of the types of measures utilized by certain existing power controllers in which case a transistor is selectively enabled and disabled, solely based on the UV (i.e., power) limits depicted in the plots. As detailed below, however, a preferred embodiment further contemplates measures of energy, that is, power over time, rather than limiting operation based on instantaneous power.

Figure 5:
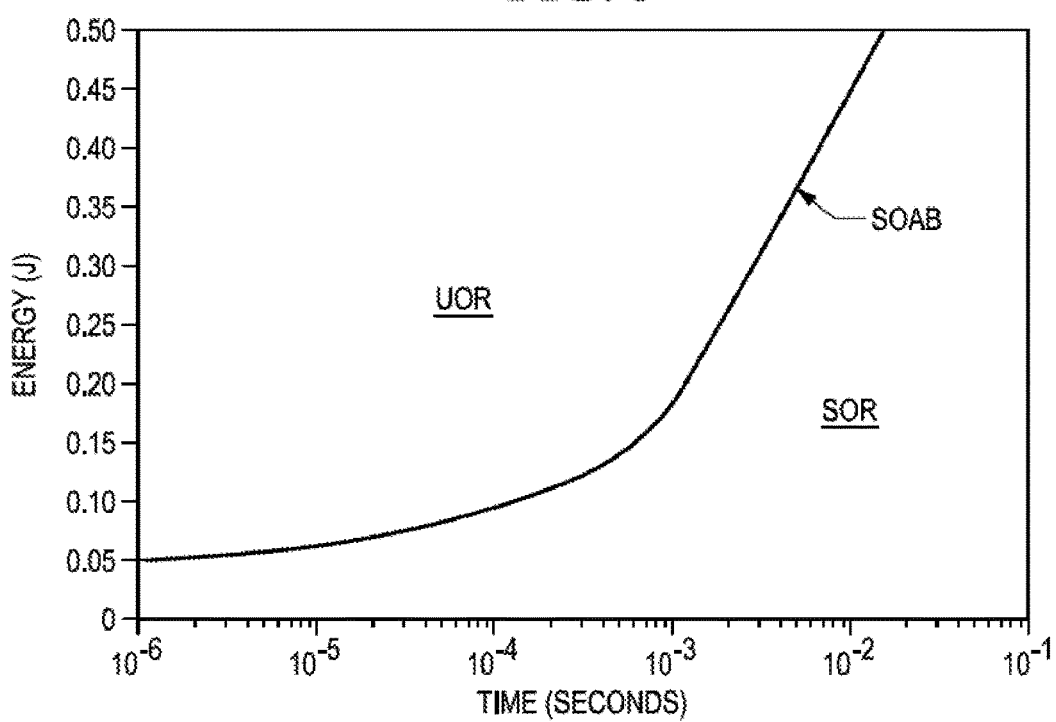
FIG. 5 illustrates a preferred embodiment safe operating area (SOA) energy profile plot, derived, for example, from a set of IN curves for a transistor.

Given the preceding, FIG. 5 illustrates a preferred embodiment SOA energy profile plot, derived, for example, from a set of UV curves for a transistor, as shown in one instance in FIG. 4. More particularly, FIG. 5 illustrates time across its horizontal axis on a logarithmic scale, and transistor energy across its vertical axis. An SOA boundary SOAB is also shown in FIG. 5, whereby an unsafe operating region UOR appears above boundary SOAB, and a safe operating region SOR appears below boundary SOAB. In a preferred embodiment, the SOAB energy plot is derived by integration of pulse power SOA data that is typically provided by an FET manufacturer, as shown by the diagonal power lines $P_1$ to $P_4$ in FIG. 5. For example, $P_1$ is higher power than $P_4$, but it has to have shorter duration for the device to be within SOA. This data provides the maximum power for increasing pulse durations, so that from each pulse duration, maximum energy can be calculated. Accordingly, the FIG. 5 SOAB is the composite of maximum energies for these pulse durations. In any event, in general, therefore, system 10 operates so that detection circuit 22 monitors the energy across transistor 14 and provides control, via the FAULT signal, so that transistor 14 is enabled only to operate in safe operating region SOR. If such energy falls within the unsafe operating region UOR, then FAULT is asserted and received by peak power management block 30 as an ALERT, and peak power management block 30 responds by disabling transistor 14 via its GATE output, with the possibility of retrying or re-enabling transistor 14 at a time when FAULT is no longer asserted by detection circuit 33. Various preferred embodiment aspects for providing such detection and control are provided below.

Figure 6:
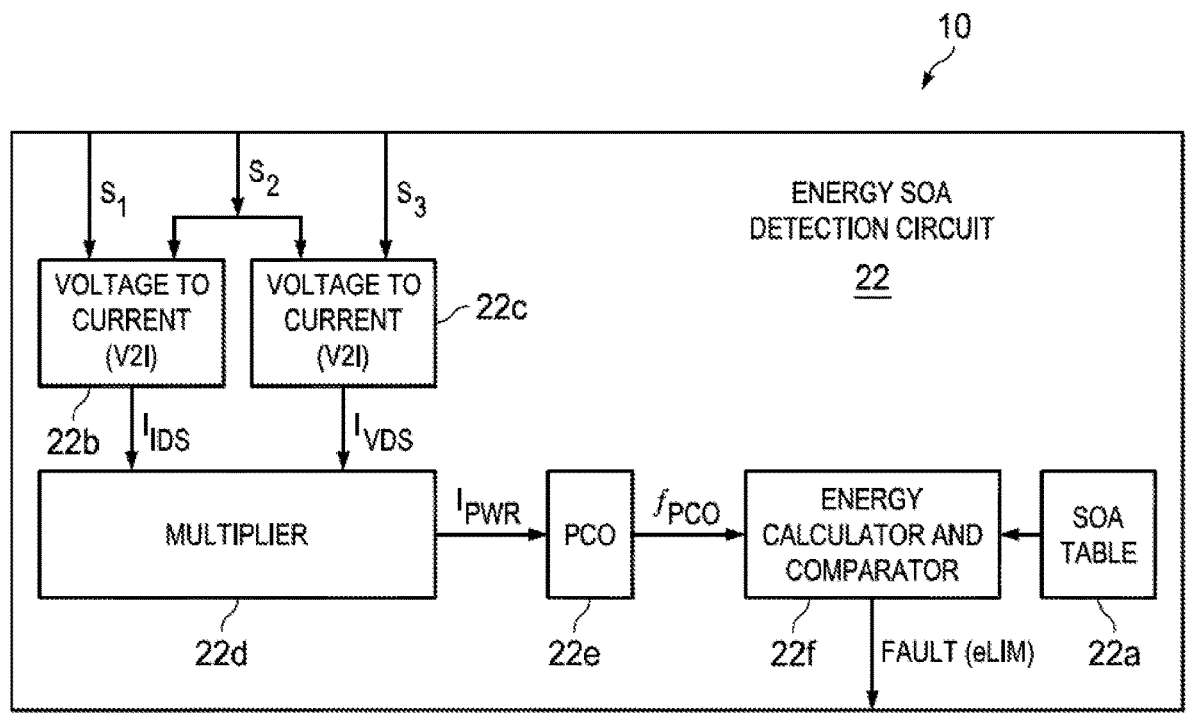
FIG. 6 illustrates an electrical block diagram of energy SOA detection circuit 16 of FIG. 1, in greater detail.

FIG. 6 illustrates an electrical block diagram of energy SOA detection circuit 22 of FIG. 1, in greater detail. Each of the blocks in FIG. 6 is described below, where one skilled in the art may ascertain various manners of implementing some of those blocks (e.g., in circuitry, software, firmware, or a combination thereof), while additional detail with respect to certain of such implementation is provided later. Looking at the general connectivity and functionality in FIG. 6, sensing inputs $S_1$ and $S_2$ are connected to a first voltage to current (V2I) converter 22b. Because sensing inputs $S_1$ and $S_2$ provide voltages representative of the drain-to-source current through transistor 14, then V2I converter 22b thereby provides a current output that is designated as $I_{IDS}$, representative of that voltage. Similarly, sensing inputs $S_2$ and $S_3$ are connected to a second voltage to current (V2I) converter 22b. Because sensing inputs $S_2$ and $S_3$ provide voltages representative of the drain-to-source voltage of transistor 14, then V2I converter 22c thereby provides a current output that is designated as $I_{VDS}$, representative of that voltage. Note that voltage-to-current converters are well-known and thus one skilled in the art may select from various conventional architectures so as to implement such circuits and their respective functionality. Each respective output of converters 22b and 22c is connected to a multiplier 22d, which multiplies those two inputs; since one input represents transistor current and the other represents transistor voltage, the product is representative of power, as indicated in the output, $I_{PWR}$, from multiplier 22d. Current multipliers are also well-known and once again, therefore, one skilled in the art may select from various conventional architectures so as to implement the multiplier circuit and functionality, such as in a bi-CMOS transistor design. The output, $I_{PWR}$, from multiplier 22d, is connected as an input to what is referred to herein as a power controlled oscillator (PCO) 22e, which as this descriptor suggests, provides an output oscillating signal, $f_{PCO}$, that has a frequency proportional to the level of power represented in the input of $I_{PWR}$, that is, the larger $I_{PWR}$, the faster the output oscillating signal, $f_{PCO}$. The output oscillating signal, $f_{PCO}$ is connected to an energy calculator and comparator 22f, which also receives as an input the data from SOA table 22a, which was introduced earlier in connection with FIG. 5. The calculating portion of block 22f calculates an energy determination based on power over time, where the power indication is from $f_{PCO}$. The comparator portion of block 16f compares the calculated energy to data in SOA table 22a, so as to determine at different time periods whether energy across transistor 14 exceeds the FIG. 5 boundary SOAB. Thus, block 22f ultimately asserts the FAULT signal if energy calculated falls within the unsafe operating region UOR of FIG. 5, or it de-asserts that FAULT signal if such energy is within the safe operating region SOR of FIG. 5. Peak power management block 30, therefore, may respond as described earlier, in response to the FAULT signal, as is also illustrated later by way of depicting an anticipated favorable operation and result achieved by a preferred embodiment.

Figure 7:
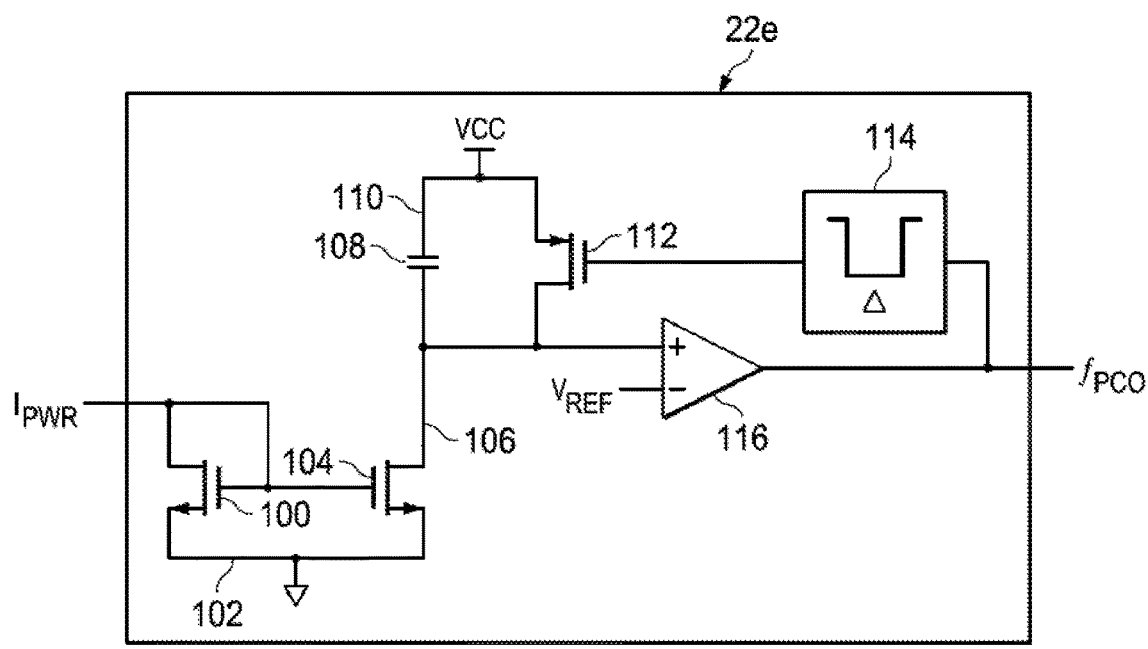
FIG. 7 illustrates a schematic of a preferred embodiment for implementing PCO 16$e$, as introduced in FIG. 6.

FIG. 7 illustrates a schematic of a preferred embodiment for implementing PCO 22e, introduced above in FIG. 6. The $I_{PWR}$ input is connected as a current source to the drain of a first n-channel field effect transistor (FET) 100, which has its source connected a node 102 and its gate connected both to its source and also to a gate of a second n-channel FET 104. The source of second FET 104 is connected to node 102, which is connected to a second reference potential, such as ground, and the drain of second FET 104 is connected to a node 106. A capacitor 108 is connected between node 108 and a node 110, where node 110 is further connected to the DC reference voltage VCC. Node 110 is also connected to the source of a p-channel FET 112, which has its drain connected to node 106 and its gate connected to an output of a delay circuit 114. The input of delay circuit 114 is connected to the output of a comparator 116. A non-inverting input of comparator 116 is connected to node 106, and an inverting input of comparator 116 is connected to a reference voltage $V_{REF}$. The output of comparator 116 is, as mentioned before, connected to the input of delay circuit 114, and it also provides the signal output of PCO 22e, that is, the frequency $f_{PCO}$, which as further demonstrated below is a frequency controlled waveform controlled by the level of the input $I_{PWR}$.

Figure 8:
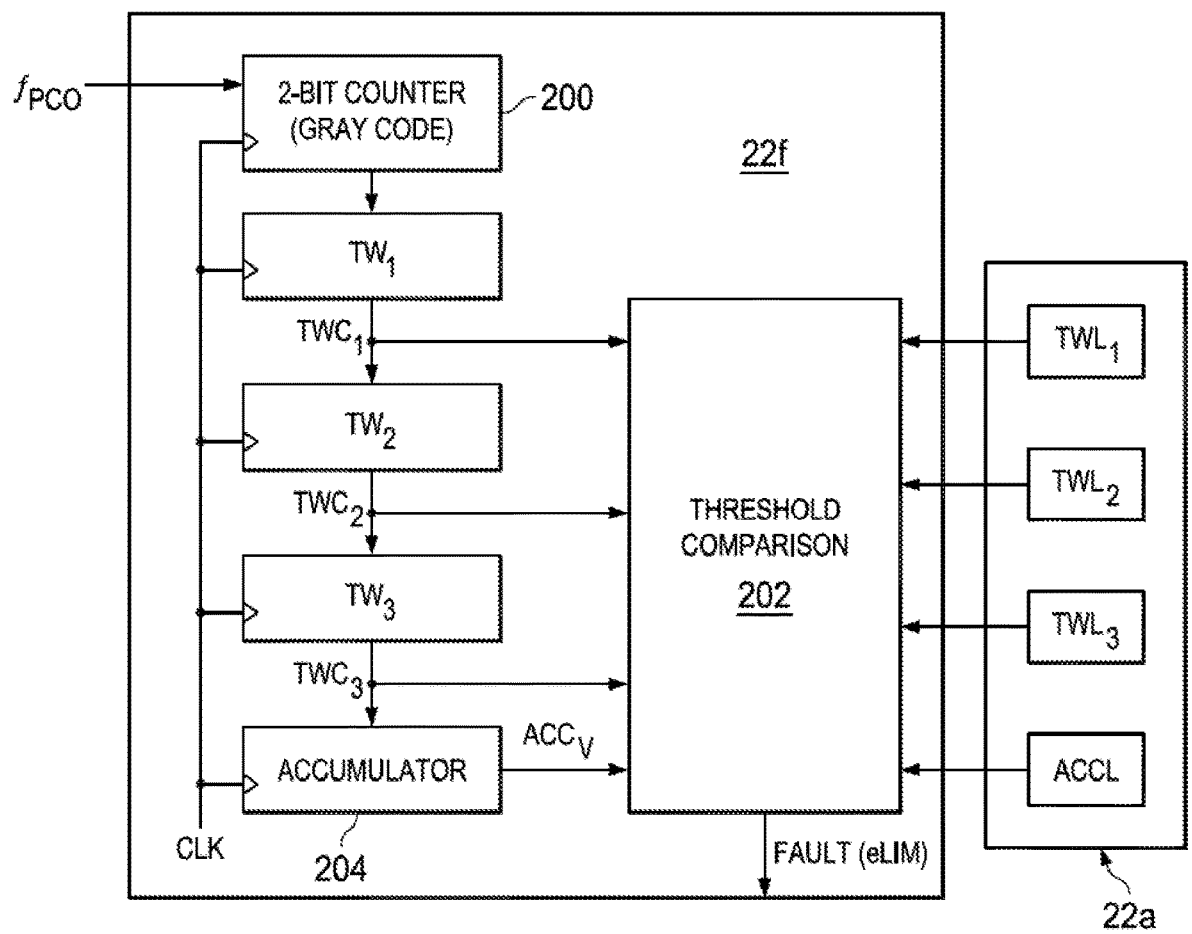
FIG. 8 illustrates an electrical block diagram with greater details shown for energy calculator and comparator 22$f$ and SOA table 22$a$, as introduced in FIG. 6.

The operation of PCO 22e is now described. Initially, comparator 114 receives $V_{REF}$ and as a result outputs a low signal, which after passing through the delay of delay circuit (e.g., 30 to 50 nsec) reaches the gate of PMOS transistor 112, thereby enabling that device. The enabled PMOS transistor 112 conducts VCC to node 106, thereby precharging that node. The precharged node 106 also inputs to the non-inverting input of comparator 116, thereby causing it to output a high value, which after passing through delay circuit 114 disables PMOS transistor 112, while capacitor 108 maintains the precharge voltage at node 106. Next, as input $I_{PWR}$ rises, FET 100 conducts and the current is also mirrored through FET 104, thereby creating a discharge of node 106, where the discharge rate is responsive to the RC effect from capacitor 108 and the resistance of NMOS transistor 104, to the extent that resistance is controlled by the level of $I_{PWR}$. From this discharge, eventually the voltage at node 106 falls below $V_{REF}$, in which case again the output of comparator 116 transitions to low, which after passing through the delay of delay circuit 114 again enables PMOS transistor 112, thereby repeating the process described above. Given the preceding, therefore, one skilled in the art will appreciate that the output of PCO 22e, $f_{PCO}$, provides a transitioning signal with a frequency that may be generally represented by the following Equation 1:

$$f_{PCO} = \frac{C(108) \times V_{REF}}{I_{PWR}} + \Delta \qquad \text{Equation 1}$$

where,

C(108) is the capacitance of capacitor 108; and $\Delta$ is the delay of a one-shot reset circuit (not separately shown) that resets the input node (capacitor) of comparator 116. Note that A also sets the width of output pulses of PCO 16e. For sake of later discussion, note that during normal operation where operation of system 10 is occurring within the safe operating area (i.e., region SOR in FIG. 5), the period of $f_{PCO}$ is expected to be at least 512 μsec by way of example, and this is noted because, as further detailed below, the preferred embodiment examines $f_{PCO}$ over time and a shorter $f_{PCO}$ period may well be interpreted as a fault condition, FIG. 8 illustrates an electrical block diagram with greater details shown for energy calculator and comparator 22f and SOA table 22a. Each of the blocks in FIG. 8 is described below, where one skilled in the art may ascertain various manners of implementing those blocks (e.g., again, in circuitry, software, firmware, or a combination thereof). In a preferred embodiment, the signal $f_{PCO}$ is input to energy calculator and comparator 22f and more particularly to a counter 200, which in the example shown is a 2-bit counter. Counter 200 counts each period transition of the signal $f_{PCO}$, and the count is reset by the assertion of a clock CLK. For reasons evident below, CLK is asserted every 100 nsec and, therefore, counter 200 counts and then resets for each successive 100 nsec period. Note also that counter 200 may be implemented as a Gray code counter, so as to avoid Nyquist limitations that may arise if the system clock (not shown) frequency is relatively close to the event being counted (i.e., period transitions in $f_{PCO}$) and to save significant capacitor area. Note that only 2 bits are needed for a count up to four, as in the example provided normal operations should yield a count no greater than four for the period being counted; of course, in other instances, such as where larger current demands are anticipated, the number of bits in counter 200 may be increased. The count output of counter 200 is connected to a first time window block $TW_1$.

First time window block $TW_1$, from an initial reset state and as synchronized by the CLK signal for every 80 CLK periods, adds to its current count each count value received from counter 200. Thus, 100 nsec after a reset, first time window block $TW_1$ receives a first count from counter 200, and thereafter for a count instance that extends until the next reset of block $TW_1$, block $TW_1$ adds to its count total each successive count received from counter 200 during that count instance. As a result, for a number of iteratively received counts from counter 200, block $TW_1$ develops a total count corresponding to a time window for block $TW_1$. For example, this iterative operation is represented in the following Equation 2:

$$TW_1 \text{ counts} = \Sigma_{i=1}^{80}(100 \text{ nsec counts from counter } 200) \quad \text{Equation 2}$$

Equation 2 is intended to indicate that, after a reset by asserting a clock CLK, counter 200 counts for a 100 nsec period, and that count concluding the 100 nsec period is output to first time window block $TW_1$; block $TW_1$ stores this first post-reset count as a total, and thereafter it adds to its total each additional consecutive 100 nsec count from counter 200, for a total of i=80 iterations, where the first iteration is the initial total from counter 200 followed by 79 adds thereafter. Hence, block $TW_1$ sums the counts received from counter 200 over an (i=80)*100 nsec=8 μsec time window period. Once block $TW_1$ concludes its summation over i=80 iterations, it outputs the summed number of counts $TWC_1$ to a threshold comparison block 202 and also to a second time window block $TW_2$. Thereafter, block $TW_1$ resets in synchronization with the next CLK signal, and it receives its next initial count from counter 200 and repeats the process described above, again to total a next set of i=80 counts received from counter 200.

Second time window block $TW_2$ operates in a comparable manner to first time window block $TW_1$ described above, but block $TW_2$ adds counts over a longer respective time window. For block $TW_2$, from an initial reset state and as synchronized by the CLK signal for every 1,280 CLK periods (i.e., 1,280*100 nsec=128 μsec), block $TW_2$ adds to its current count each count value received from block $TW_1$. Thus, after a block $TW_2$ reset, second time window block $TW_2$ receives a first count from block $TW_1$, and thereafter for a 128 μsec count instance that extends until its next reset, block $TW_2$ adds to its total each successive count received from block $TW_1$ during that count instance. As a result, for a number of iterations, block $TW_2$ develops a total count corresponding to a time window for block $TW_2$, and this iterative operation is represented in the following Equation 3:

$$TW_2 \text{ counts} = \Sigma_{i=1}^{16}(8 \text{ μsec counts from block } TW_1) \quad \text{Equation 3}$$

Equation 3 is intended to indicate that, after a resetting instance from a transition of CLK, block $TW_2$ stores a first post-reset count from block $TW_1$ as a total, and thereafter for 15 more iterations block $TW_2$ adds to its total each additional consecutive 8 μsec count from block $TW_1$, for a total of i=16 iterations of count values received from block $TW_1$. Hence, block $TW_2$ sums the counts received from block $TW_1$ over a 128 μsec time window period. Once block $TW_2$ concludes its summation over i=16 iterations, it outputs the summed number of counts $TWC_2$ to threshold comparison block 202 and also to a third time window block $TW_3$. Thereafter, block $TW_2$ resets in synchronization with the next CLK signal, and it receives its next initial count from block $TW_1$ and repeats the process described above, again to total i=16 count values received from block $TW_1$.

Third time window block $TW_3$ operates in a comparable manner to first and second time window blocks $TW_1$ and $TW_2$ described above, but block $TW_3$ adds counts over still a longer time window. For block $TW_3$, from an initial reset state and as synchronized by the CLK signal for every 10,240 CLK periods (i.e., 10,240*100 nsec=1,024 μsec), block $TW_3$ adds to its current count each count value received from block $TW_2$. Thus, after a block $TW_3$ reset, third time window block $TW_3$ receives a first count from block $TW_2$, and thereafter for a 1,024 μsec count instance that extends until its next reset, block $TW_3$ adds to its total each successive count received from block $TW_2$ during that count instance. As a result, for a number of iterations, block $TW_3$ develops a total count corresponding to a time window for block $TW_3$, and this iterative operation is represented in the following Equation 4:

$$TW_3 \text{ counts} = \Sigma_{i=1}^{8}(128 \text{ μsec counts from block } TW_2) \quad \text{Equation 4}$$

Equation 4 is intended to indicate that, after a resetting instance from a transition of CLK, block $TW_3$ stores a first post-reset count from block $TW_2$ as a total, and thereafter for 7 more iterations block $TW_3$ adds to its total each additional consecutive 128 μsec count from block $TW_2$, for a total of i=8 iterations of count values received from block $TW_2$. Hence, block $TW_3$ sums the counts received from block $TW_2$ over a 1,024 μsec time window period. Once block $TW_3$ concludes its summation over i=8 iterations, it outputs the summed number of counts $TWC_3$ to threshold comparison block 202 and also to an accumulator 204. Thereafter, block $TW_3$ resets in synchronization with the next CLK signal, and it receives its next initial count from block $TW_2$ and repeats the process described above, again to total i=8 count values received from block $TW_2$.

Accumulator 204 receives count $TWC_3$ from third time window block $TW_3$ and adds that to any earlier received value from block $TWC_3$, without resetting under normal operations. Thus, over successive 1,024 μsec time windows for block $TW_3$, if block $TW_3$ outputs a non-zero count, then the value in accumulator 204 may tend to increase from successive non-zero values received from block $TW_3$. In addition, however, accumulator 204 further operates to decrement its accumulated count at a fixed frequency, which in a preferred embodiment example is a decrement of one count per 512 μsec. In this regard, recall that third time window block $TW_3$ produces a new count output for count $TWC_3$, every 1,024 μsec. In effect, therefore, accumulator 204 will decrement that count a first time, halfway along the period at which it is receiving counts from time window block $TW_3$, and it will decrement again a second time, 512 μsec after the halfway point, so as to decrement twice during each 1,024 μsec period. Further, the count value $ACC_V$ accumulated in accumulator 204 is also input to threshold comparison block 202.

Figure 9:
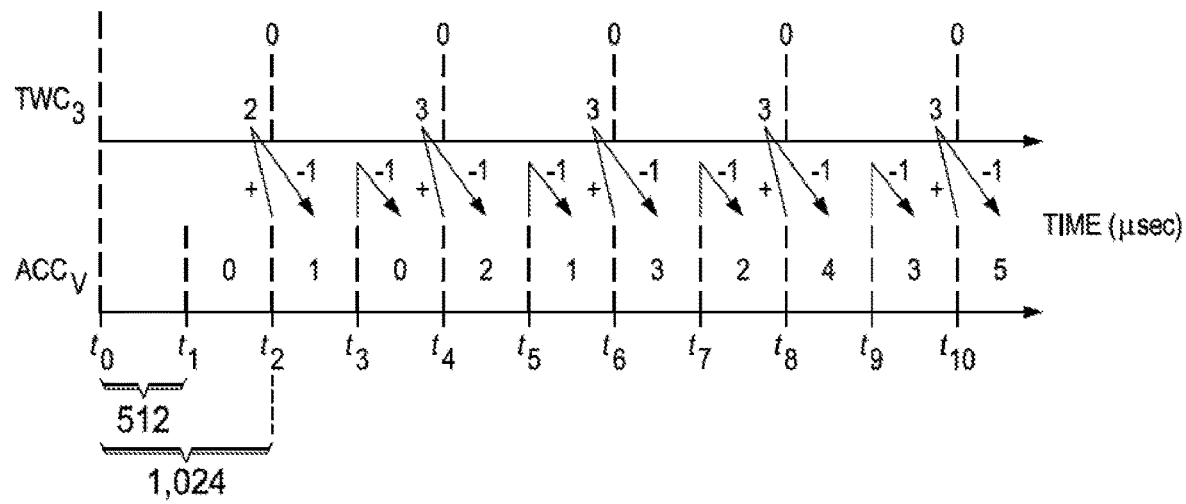
FIG. 9 illustrates a timing diagram depicting a relationship between a time window count $TWC_3$ and an accumulated value $ACC_V$ in an accumulator.

To further illustrate the operation of accumulator 204 and its relationship to the count $TWC_3$ from block $TW_3$, FIG. 9 illustrates a timing diagram with 512 μsec increments between timing events $t_0, t_1, \ldots t_{10}$. A top plot illustrates an example of a respective count $TWC_3$ for third time window block $TW_3$ as determined at each of its 1,024 μsec time windows, and a bottom plot illustrates the corresponding example of the respective accumulated value $ACC_V$ in accumulator 204. By way of example, therefore, following a reset at time $t_0$, block $TW_3$ begins to count and reaches a count of $TWC_3=2$ by the completion of its first 1,024 μsec time window, as shown at time $t_2$; meanwhile, accumulator 204 is reset to a value $ACC_V$ of 0. At time $t_2$, block $TW_3$ resets its count to a value of 0 (as shown above the vertical dashed time line at $t_2$), while at the same time accumulator 204 receives the count of $TWC_3=2$ and adds it to its current accumulated value of 0 for a total of 2+0=2, while in addition accumulator 204 decrements by one every 512 μsec, so at the same time this amount is reduced by 1, leaving a total value of $ACC_V=2+0-1=1$ counts remaining in accumulator 204 immediately following time $t_2$. Once 512 μsec again expires after time $t_2$, that is, as of time $t_3$, then accumulator 204 again decrements by 1, at which point its accumulated value $ACC_V$ is reduced to $1-1=0$. Meanwhile, block $TW_3$ continues to count during its second 1,024 μsec time window between times $t_2$ and $t_4$, and in the example illustrated, again during this time window $TWC_3$ reaches a value of 3, as shown immediately before time $t_4$. At time $t_4$, block $TW_3$ again resets its count to a value of 0, while at the same time accumulator 204 receives the count of $TWC_3=3$, adds it to its current accumulated value of 0 and decrements by 1, so the total of $ACC_V=3+0-1=2$ remains in accumulator 204 immediately following time $t_4$. Continuing the illustrated example, once 512 μsec again expires after time $t_4$, that is, as of time $t_5$, then accumulator 204 again decrements by 1, at which point its accumulated value is reduced to $ACC_V=2-1=1$, and meanwhile block $TW_3$ continues to count during its third 1,024 μsec time window between times $t_4$ and $t_6$ and in the illustrated example $TWC_3$ again reaches a value of 3, as shown immediately before time $t_6$. At time $t_6$, block $TW_3$ again resets its count to a value of 0, while at the same time accumulator 204 receives the count of $TWC_3=3$, adds it to its current accumulated value of 1 and decrements by 1, so the total of $ACC_V=3+1-1=3$ remains in accumulator 204 immediately following time $t_6$.

Given the preceding, one skilled in the art should appreciate the ongoing operation of accumulator 204 and its relationship with the preceding time window blocks $TW_1$, $TW_2$, and $TW_3$. Each time window block $TW_x$ amasses a count corresponding to the number of period cycles in frequency $f_{PCO}$ during a respective time window, and ultimately accumulator 204 has a value that rises with a greater number of counts but may steadily fall by its auto-decrement for each successive 512 μsec period. If $TWC_3$ remains near or at zero, therefore, the decrementing of accumulator 204 will keep its value also near zero. However, if $TWC_3$ remains at a value of 3 (or above), note therefore that the accumulator value will steadily increase, as its decrementing twice during each 1,024 μsec time window for block $TW_3$ will be insufficient to return the accumulated value toward 0. In this regard, for example, note further the continuing example in FIG. 9 at times $t_7$ and $t_8$. Specifically, at time $t_7$, accumulator 204 decrements its value from 3 to 2, but at time $t_8$, the $TWC_3$ value of 3 is added to the accumulated value of 2 and then decremented, leaving a value of 4 in accumulator 204. A similar occurrence happens at time $t_{10}$, so note in this pattern the accumulated value will continue to climb. The preferred embodiment consequences to such a climb, as well as the remaining blocks and operation of the FIG. 8 comparator 22f and SOA table 22a, are further discussed below.

Given the preceding, one skilled in the art may readily appreciate that each of the time window counts $TWC_1$, $TWC_2$, and $TWC_3$ represent a real-time measure proportional to load energy, that is, proportional to the amount of load current $I_L$ (see, FIG. 1) that has been sensed over a corresponding amount of time, where the time depends on the time window per each of blocks $TW_1$, $TW_2$, and $TW_3$. For example, as block $TW_1$ counts over time, it is in effect counting a signal (i.e., $f_{PCO}$) representative of load current $I_L$ flow during that time; moreover, therefore, and as known in the art, current over time represents energy. Each of the remaining time window blocks operates similarly, and the accumulator value $ACC_V$ also is such a representation, albeit one that can decrement over time periods when load current is relatively low, yet will also increase and continue to increase, without fully decrementing, if load current is relatively high. Thus, the calculating portion of block 16f includes numerous stages that measure energy over different respective time periods.

Given the preceding observations, and returning to FIG. 8, threshold comparison block 202 also receives time window limit values $TWL_x$ and an accumulator value ACCL from SOA table 22a. In a preferred embodiment, each time window limit value $TWL_x$ corresponds to a respective time window count $TWC_x$, that is: (1) time window limit value $TWL_1$ corresponds to a respective time window count $TWC_1$; (2) time window limit value $TWL_2$ corresponds to a respective time window count $TWC_2$; and (3) time window limit value $TWL_3$ corresponds to a respective time window count $TWC_3$. Lastly, accumulator value ACCL corresponds to the count value $ACC_V$ in accumulator 204. Given these corresponding values, threshold comparison block 202 operates to compare each pair of respective corresponding values and to assert the FAULT signal if any count $TW_x$ or $ACC_V$ exceeds its respective limit $TWL_x$ or ACCL. Thus, in a preferred embodiment, one skilled in the art establishes a respective number for each of the values of $TWL_x$ and ACCL that corresponds to a sufficiently large number of counted or accumulated cycles of $f_{PCO}$, which thereby also corresponds to a relatively large amount of energy, as driven by the load current $I_L$ over time. In other words, the combined blocks in FIG. 8 provide a staged threshold comparison block 202 which, in effect, permits analysis of energy evaluation for a relatively short time (i.e., $TW_1$) relative to the limit $TWL_1$, a medium amount of time (i.e., $TW_2$) relative to the limit $TWL_2$, or a relatively longer time (i.e., $TW_3$) relative to the limit $TWL_3$, along with an ongoing accumulation over all ongoing operational time, between overall circuit resets, or the like (i.e., $ACC_V$ relative to ACCL). So long as each of the evaluated values remains within its respective limit, then FAULT is not asserted and power transistor 14 remains enabled, thereby sourcing load current $I_L$ to load 18. If, however, any of the evaluated values exceeds its respective limit, then FAULT is asserted and, as described earlier, control block 18 receives the FAULT as an ALERT and operates via its GATE output to disable the conductivity of power transistor 14, thereby potentially protecting the load 20 or the power transistor 14 from excessive energy events that otherwise could unduly stress or damage those devices. Moreover, in a preferred embodiment, once the FAULT signal is asserted, it continues to be asserted until all values $TWC_1$ through $TWC_3$ and $ACC_V$ return to zero. Thereafter, FAULT is de-asserted, at which time control block 18 may retry, that is, re-enable the GATE signal to power transistor 14. Below, such operation and resulting benefits are further illustrated, by ways of example.

As a numerical example, assume that under a given state of operation, for transistor 14, $I_{DS}=108a$ and $V_{DS}=48V$, so that power=108×485.2 kW. Assume also that through converters 22b and 22c, these $I_{DS}$ and $V_{DS}$ values convert, respectively, to $I_{IDS}=4$ μA and $I_{VDS}=4$ μA. Moreover, assume that the product of these powers, as input to PCO 16e via $I_{PWR}$, results in $f_{PCO}=1.75$ MHz. Each PCO cycle, therefore, represents 5.2 kW/1.75 MHz=3 mJ energy. Thus, in order to fault detect beyond a limit of 100 mJ for a 128 μsec period, then $TWL_2$ is set to 100 mJ/3 mJ≈33 counts. In other words, since time window block $TW_2$ accrues counts over a 128 μsec period, then so long as those counts are 33 or below, then 100 mJ of energy has not been measured during that period; if, however, the count $TWC_3$ exceeds 33, then energy has exceeded 100 mJ, and the FAULT is asserted as described above. Of course, the above numbers are only by way of example, and one skilled in the art may appreciate numerous other examples and conditions, as well as comparable applicability to other time windows and to accumulator 204

Figure 10:
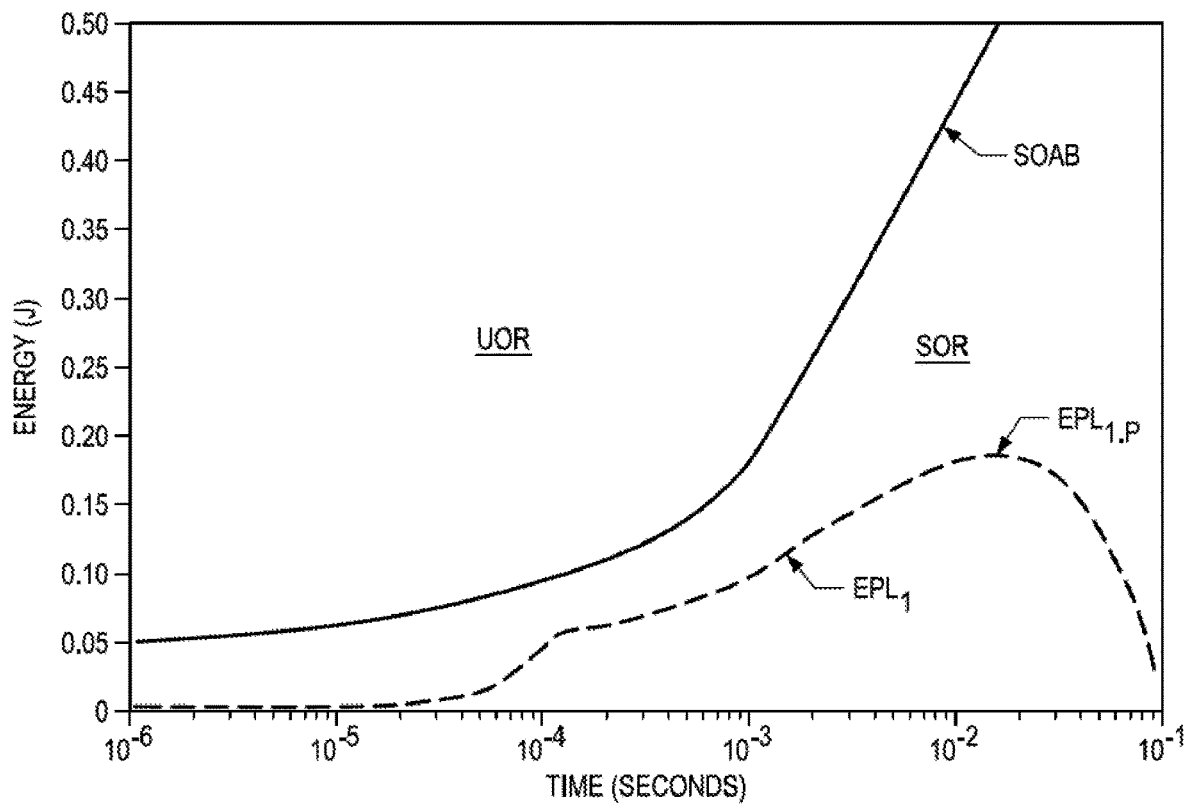
FIG. 10 repeats the illustration of FIG. 5, but adds an energy plot line $EPL_1$ to demonstrate an example of the SOA location of an energy profile of load current $I_L$ through a load.

FIG. 10 repeats the illustration of FIG. 5, but adds an energy plot line $EPL_1$ (shown as a dashed line) to demonstrate an example of the energy profile of load current $I_L$ through load 20. Note that plot line $EPL_1$ has a peak $EPL_{1,P}$ that may occur at power-up, when driving an incandescent bulb as the load at low temperature (e.g., −40° C.), and indeed note further that the energy profile rolls off after peak $EPL_{1,P}$, thereby representing that after a certain time driving a bulb, the continuing drive energy expended is less than the package/assembly is able to dissipate, so the dissipation thereby reduces the accumulated energy on the device going down to zero for long term operation. Looking before the roll-off at peak $EPL_{1,P}$, it may occur when current $I_L$ experiences what is considered an in-rush level for a relatively short period of time, during which the real-time current magnitude may exceed the manufacturer specification or datasheet current. Indeed, in a prior art implementation, an in-rush event may cause a power controller to turn off the power transistor through which the current is provided, as instantaneous current at that time and given circuit temperature, may be too excessive (see, e.g., FIG. 2). In the preferred embodiment, however, because the energy of the current over time is evaluated and used as a condition to control the transistor, then even at peak $EPL_{1,P}$ the amount of energy is still within the safe operating region SOR (i.e., below SOAB) and, therefore, the transistor remains on and current is continuously provided to load 20 (e.g., bulb). In other words, in terms of FIG. 6, even with instantaneous high current levels, the time-related counts within blocks $TW_1$ through $TW_2$ and accumulator 204 remain below their respective limits $TWL_1$ through $TWL_3$ and ACCL. Thus, the preferred embodiment is operable to maintain current $I_L$ in conditions where the prior art would disable it. Moreover, one skilled in the art also should now further appreciate the effect of the counts and decrementing in accumulator 204. Specifically, once a limit is exceeded, FAULT is asserted, and transistor 14 is gated off, accumulator 204 may still contain counts and they will only diminish as additional time passes, so that each count is decremented at a rate of one count/512 µsec, while FAULT will therefore remain asserted. Thus, until accumulator 204 fully decrements to zero, FAULT remains asserted and, hence, current IL is not allowed to flow as power transistor 14 remains disabled. During this time, therefore, a retry does not occur and energy may dissipate at a controlled rate, such as that equivalent to the rate of thermal dissipation associated with either the integrated circuit package or printed circuit board (PCB) associated with either load 20 or the entirety of system 10. Thus, when a retry does occur, after $ACC_V$ reaches zero, adequate thermal energy is also dissipated so as not to overly stress the power transistor on the next attempted retry.

Having demonstrated various results in FIG. 10, then returning to FIG. 8 one skilled in the art can now appreciate that each of the energy limits of the values $TWL_x$ and accumulator value ACCL may be set with numbers that may be derived from the SOA boundary SOAB, according to the safe operating energy limit shown by that boundary over different amounts of time. With such limits, FIG. 10 illustrates an example where system 10 is operating within the safe operating area, and note therefore that energy plot line $EPL_1$ always remains in safe operating region SOR. To maintain such operation, therefore, as each time window block periodically assesses energy through power transistor 14, threshold comparison block 202 respectively confirms that no respective energy limit (from SOA table 22a) is exceeded and, hence, control block 18 continues to enable power transistor 14. To the contrary, if any of the limits is exceeded, then $I_L$ is disrupted so as to not unduly stress or potentially damage system components and adequate time is allotted before retry or re-enablement $I_L$, so as to adequately dissipate energy again to protect the system.

Figure 11:
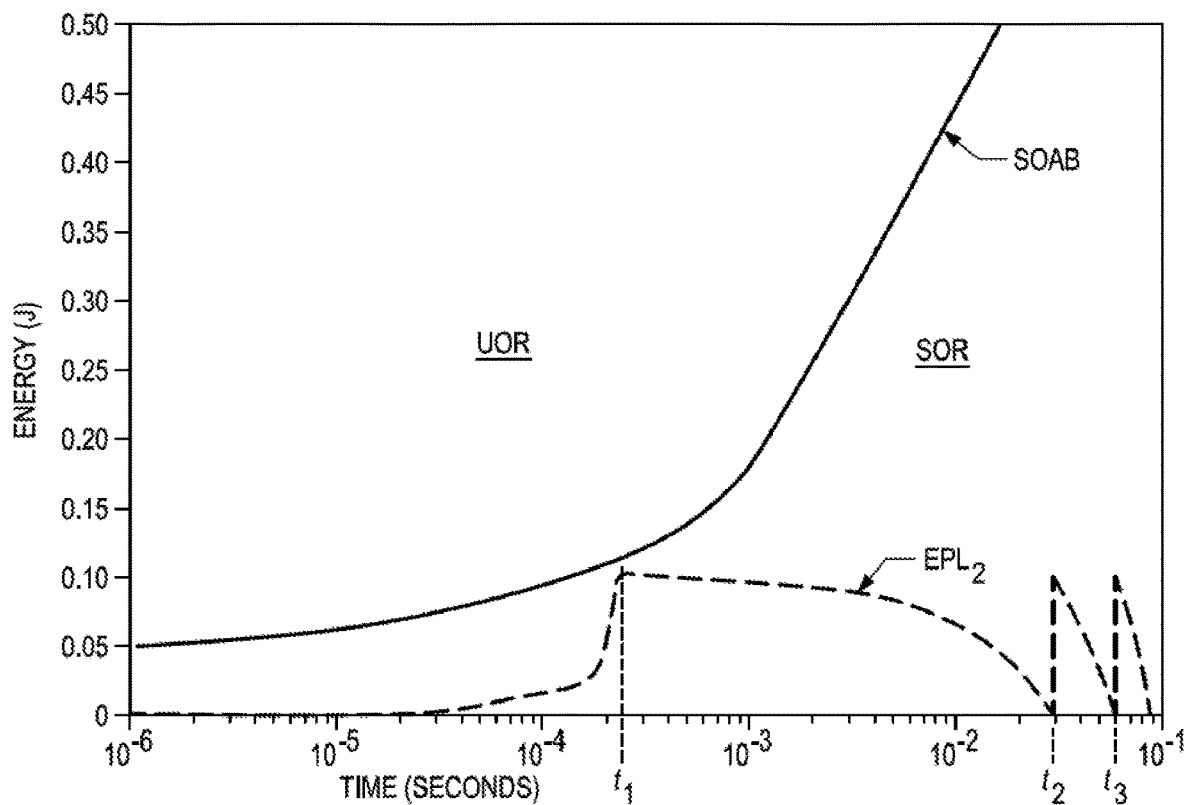
FIG. 11 repeats the illustration of FIG. 5, but adds an energy plot line $EPL_2$ to demonstrate a second example of the SOA location of an energy profile of load current $I_L$ through a load.

FIG. 11 repeats the illustration of FIG. 5, but has a second alternative energy plot line $EPL_2$ to demonstrate an alternative example of an energy profile of load current $I_L$ through load 20. The FIG. 11, example, however, demonstrates an instance, such as a short-circuit, where a measure of current $I_L$ increases rapidly around a time indicated at $t_1$, that is, as shown where energy plot line $EPL_2$ begins to rise in a near-vertical fashion. According to one preferred embodiment, recall that peak power management block 30 of FIG. 1 may receive alternative fault conditions, including from a current detection circuit that monitors a measure of the current $I_L$, and that also alerts block 30 if the sensed current exceeds a given limit. In FIG. 11, therefore, such an instance occurs at time $t_1$, whereby current begins to rise very quickly and, hence, so does energy as shown in plot $EPL_2$. However, prior to the energy reaching the SOAB boundary, control block 18 may alternatively respond to the detected condition (i.e., alternative FAULT) from the current detection circuit and, in response, peak power management block 30 disables its GATE output, thereby disabling the gate potential to, and the operation of, transistor 14. Thus, immediately following time $t_1$, FIG. 11 illustrates that energy across transistor 14 begins to decline until a time $t_2$, which is approximately 30 msec following time $t_1$.

Further according to the preferred embodiment, peak power management block 30 does not re-enable its GATE signal solely in response to the current fault being cleared, but instead it continues to maintain its GATE output disabled until the energy, as monitored by energy SOA detection circuit 22, falls below a threshold, which threshold could be even down to a level of zero. In contrast, in the prior art where only current may be monitored in a context such as the one presently described, then a prior art control circuit may tend to re-enable (i.e., retry) the transistor gate very quickly, such as based solely on a measure of time, after the transistor was disabled; in such a prior art approach, therefore, current is repeatedly turned on and turned back off, if the short circuit condition persists. As a result, if the prior art retry time period is relatively short, additional energy accumulates across the transistor for each of the successive turn on/off periods, that is, without ample time in each instance for such energy to dissipate, it accumulates and thereby poses or causes damage to the transistor. In contrast, in a preferred embodiment and as shown in FIG. 11, even if the current condition is cured, or if the current detection circuit automatically releases its fault based on a short time period after the excessive current condition was detected, peak power management block 30 adds the additional protective step of awaiting dissipation of energy, as occurs at time $t_2$. At that time, therefore, peak power management block 30 re-enables GATE and transistor 14. In the example illustrated, however, the short-circuit condition persists, so at time $t_2$, again the energy plot rises very quickly as shown by the vertical transition at that time, and in response the same response occurs as did at time $t_1$, namely, peak power management block 30 is so notified as an alternative fault condition and transistor 14 is disabled. Again, following time $t_2$, the retry is delayed until energy, as shown in plot $EPL_2$, dissipates all the way to zero, so another 30 msec passes between the successive retries. In this manner, and for any additional successive retries, in each instance the amount of energy imposed across transistor 14 is limited to below the boundary SOAB. As a result, even in the instance of multiple successive retries, transistor 14 is protected, as compared to a current-only detection approach of the prior art.

Given the preceding, the preferred embodiments provide a beneficial and improved electronic power driven systems, such as those driven with power FETs. The preferred embodiments permit the power driving of a load under potentially high current situations, either anticipated (e.g., cold start-up) or undesirable (e.g., short circuit), where protection is afforded of the power system while also permitting flexibility to safely turn on a load if energy constraints associated with the system are not exceeded. Numerous other benefits arise from the preferred embodiments, and still others may be ascertained by one skilled in the art. As further examples, therefore, one or more fault events may be detected, with appropriate protection steps taken in view of those events. The fault events may be of a same or differing types. Moreover, the number of instances of successive faults that are tolerated while maintaining nominal operation may be adjusted, with a foldback occurring to a lesser stressing current supply (or other operational aspect(s)) during the foldback. Moreover, if the fault event is detected to no longer persist, operation may return from the foldback mode to a higher, and even nominal mode. Thus, the preferred embodiments permit peak power transients to a certain level, while also protecting against current faults, energy faults, and temperature faults. As another example, while one preferred embodiment implementation has been described in connection with an incandescent bulb in an automotive application as the load, various other implementations will benefit. As another example, reliability is improved by disabling the power transistor until the fault is removed. As still another example, the preferred embodiment may be implemented with non-complex circuitry (e.g., state machine; PCO circuitry combined with a Gray-coded counter). In view of the above, therefore, the inventive scope is far reaching, and while various alternatives have been provided according to the disclosed embodiments, still others are contemplated and yet others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

We claim:

1. A power circuit comprising:
 a power source terminal and a circuit ground terminal;
 a first sensing input adapted to be coupled to a connection between a power source and a reference resistor;
 a second sensing input adapted to be coupled to a connection between the reference resistor and a first current terminal of a power transistor;
 a third sensing input adapted to be coupled to a connection between a second current terminal of the power transistor and a load;
 a fourth sensing input adapted to be coupled to a temperature sensor coupled to the power transistor;
 a gate output adapted to be coupled to a control terminal of the transistor; and
 state machine circuitry having inputs coupled to the first sensing input, the second sensing input, the third sensing input, and the fourth sensing input, and having an output coupled to the gate output.

2. The power circuit of claim 1 including current detection circuitry having inputs coupled to the first sensing input and the second sensing input and having a current limit event output.

3. The power circuit of claim 1 including current detection circuitry having inputs coupled to the first sensing input and the second sensing input, having a current limit event output, and having a reduced threshold limit input.

4. The power circuit of claim 3 including power management circuitry having a current limit event input coupled to the current limit event output and having a reduced threshold limit output coupled to the reduced threshold limit input, the power management circuitry including the state machine circuitry.

5. The power circuit of claim 1 including energy detection circuitry having inputs coupled to the first sensing input, the second sensing input, and the third sensing input and having an energy limit event output.

6. The power circuit of claim 5 including power management circuitry having an energy limit event input coupled to the energy limit event output, the power management circuitry including the state machine circuitry.

7. The power circuit of claim 1 including temperature detection circuitry having an input coupled to the fourth sensing input, having an absolute temperature event output, and having a relative temperature event output.

8. The power circuit of claim 7 including power management circuitry having an absolute temperature event input coupled to the absolute temperature event output, and having a relative temperature event input coupled to the relative temperature event output, the power management circuitry including the state machine circuitry.

9. The power circuit of claim 1 including power management circuitry that includes the state machine circuitry.

10. The power circuit of claim 1 including power management circuitry that includes the state machine circuitry, the power management circuitry having an enable input and the gate output.

11. The power circuit of claim 1 in which the state machine circuitry includes a reset state.

12. The power circuit of claim 1 in which the state machine circuitry includes a disabled state.

13. The power circuit of claim 12 in which the state machine circuitry includes an enable charge pump state.

14. The power circuit of claim 1 in which the state machine circuitry includes a first gate on state.

15. The power circuit of claim 1 in which the state machine circuitry includes a second gate on state.

* * * * *